(12) United States Patent
Lin

(10) Patent No.: US 8,488,801 B2
(45) Date of Patent: Jul. 16, 2013

(54) AUDIO COMPENSATION UNIT AND COMPENSATING METHOD AND AUDIO PROCESSING DEVICE THEREOF

(75) Inventor: Shi-Quan Lin, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 563 days.

(21) Appl. No.: 12/750,874

(22) Filed: Mar. 31, 2010

(65) Prior Publication Data

US 2011/0044472 A1 Feb. 24, 2011

(30) Foreign Application Priority Data

Aug. 20, 2009 (CN) .......................... 2009 1 0305857

(51) Int. Cl.
*H04R 29/00* (2006.01)
*H02B 1/00* (2006.01)
*H03G 9/00* (2006.01)

(52) U.S. Cl.
USPC .............................. 381/56; 381/123; 381/102

(58) Field of Classification Search
USPC ................. 381/56–59, 98–103, 120–121, 123
See application file for complete search history.

(56) References Cited

U.S. PATENT DOCUMENTS

| 4,994,770 | A | * | 2/1991 | Niwayama | .................. | 333/28 T |
| 5,983,191 | A | | 11/1999 | Ha et al. | | |
| 6,275,593 | B1 | * | 8/2001 | Garcia et al. | .................... | 381/98 |
| 6,590,984 | B2 | * | 7/2003 | Ohama et al. | ................... | 381/56 |
| 7,388,959 | B2 | * | 6/2008 | Gagon | ............................. | 381/98 |
| 2002/0118846 | A1 | * | 8/2002 | Narusawa | ..................... | 381/103 |

FOREIGN PATENT DOCUMENTS

| CN | 1206984 A | 2/1999 |
| CN | 1458805 A | 11/2003 |

* cited by examiner

*Primary Examiner* — Mohammad Islam
*Assistant Examiner* — David Ton
(74) *Attorney, Agent, or Firm* — Atlis Law Group, Inc.

(57) ABSTRACT

An audio compensation unit includes a detection subunit and a compensation subunit. The detection subunit is for detecting an audio signal to obtain an original frequency. The detection subunit defines a predetermined low frequency band and a predetermined high frequency band. The detection subunit is also for generating a first control signal when the original frequency is within the low frequency band, and a second control signal when the original frequency is within the high frequency band. The compensation subunit includes an electronic switch, a first compensation circuit, and a second compensation circuit. The electronic switch enables the first compensation circuit according to the first control signal, for compensating the audio signal. The electronic switch is further enables the second compensation circuit according to the second control signal, for compensating the audio signal.

13 Claims, 4 Drawing Sheets

US 8,488,801 B2

AUDIO COMPENSATION UNIT AND COMPENSATING METHOD AND AUDIO PROCESSING DEVICE THEREOF

BACKGROUND

1. Technical Field

The present disclosure relates to audio processing devices and, particularly, to an audio processing device capable of compensating audio signals.

2. Description of Related Art

With nonlinear characteristics of an electronic device, a frequency response curve of an audio amplifier of an electronic device remains flat in a middle frequency band, it decreases obviously in a high frequency band and a low frequency band. When the audio amplifier amplifies the audio signals, the gains of the audio signals fall in the high frequency band and the low frequency band while increasing in the middle frequency band.

It is well known that the high frequency band and the low frequency band of the audio signals are two important keys to form quality sound. The decrease of the high frequency band causes the sound to be scattered. The decrease of the low frequency band causes the sound to be tinny and distorted.

Therefore, it is desirable to provide an audio compensation unit, which can overcome the above-mentioned limitations.

BRIEF DESCRIPTION OF THE DRAWINGS

The components of the drawings are not necessarily drawn to scale, the emphasis instead being placed upon clearly illustrating the principles of the embodiments of an audio processing device capable of compensating audio signals. Moreover, in the drawings, like reference numerals designate corresponding parts throughout several views.

DETAILED DESCRIPTION

Figure 1:
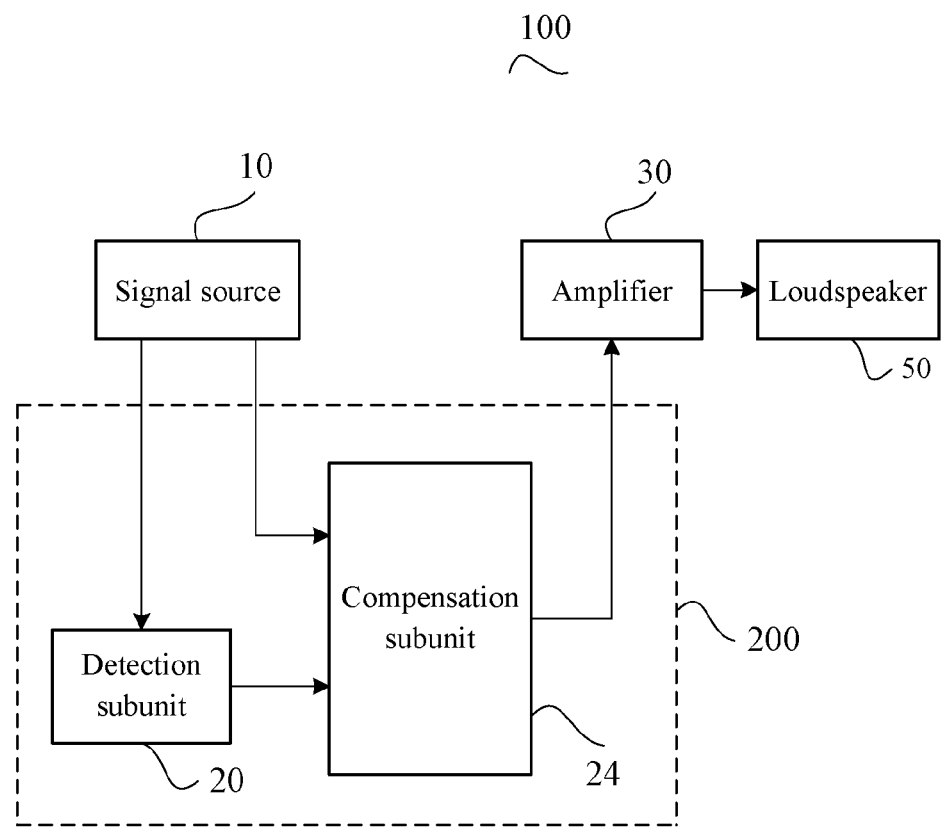
FIG. 1 is a block diagram of an audio processing device in accordance with an exemplary embodiment, including an audio compensation unit.

Referring to FIG. 1, a block diagram of an audio processing device 100 is illustrated according to an exemplary embodiment. The audio processing device 100 may be a portable digital versatile disc (DVD) player or a MP3 player. The audio processing device 100 includes a signal source 10, an audio compensation unit 200, an amplifier 12, and a loudspeaker 50.

The signal source 10 is configured for supplying audio signals. The audio signals may be decoded by a digital signal processing (DSP) chip of the audio processing device 100. The audio compensation unit 200 is configured for automatically compensating the audio signals. The amplifier 30 is configured for amplifying the compensated audio signals. The amplifier 30 may include an audio amplifier and a power amplifier. The loudspeaker 50 is configured for outputting the amplified audio signals.

The audio compensation unit 200 includes a detection subunit 20, and a compensation subunit 24.

The detection subunit 20 is configured for detecting an audio signal from the signal source 10 to obtain an original frequency $f_i$ of the audio signal. The detection subunit 20 is preset with a predetermined high reference frequency $f_{Href}$, a predetermined low reference frequency $f_{Lref}$, a predetermined high benchmark frequency $f_{H1}$, and a predetermined low benchmark frequency $f_{L1}$. All the predetermined frequencies are stored in the detection subunit 20 in advance, and can be modified by users.

The detection subunit 20 is further configure for determining whether the original frequency $f_i$ satisfies one of following equations:

$$f_{L1} < f_i < f_{L1} + f_{Lref} \qquad (1)$$

$$f_{H1} < f_i < f_{H1} + f_{Href} \qquad (2)$$

$$f_{L1} + f_{Lref} < f_i < f_{H1} \qquad (3)$$

When the original frequency $f_i$ satisfies the expression (1), the detection subunit 20 generates a first control signal. When the original frequency $f_i$ satisfies the expression (2), the detection subunit 20 generates a second control signal. The detection subunit 20 generates a third control signal, when the original frequency $f_i$ satisfies the expression (3). A low frequency band is defined by the expression (1), and a high frequency band is defined by the expression (2). A middle frequency band is defined by the expression (3).

Figure 2:
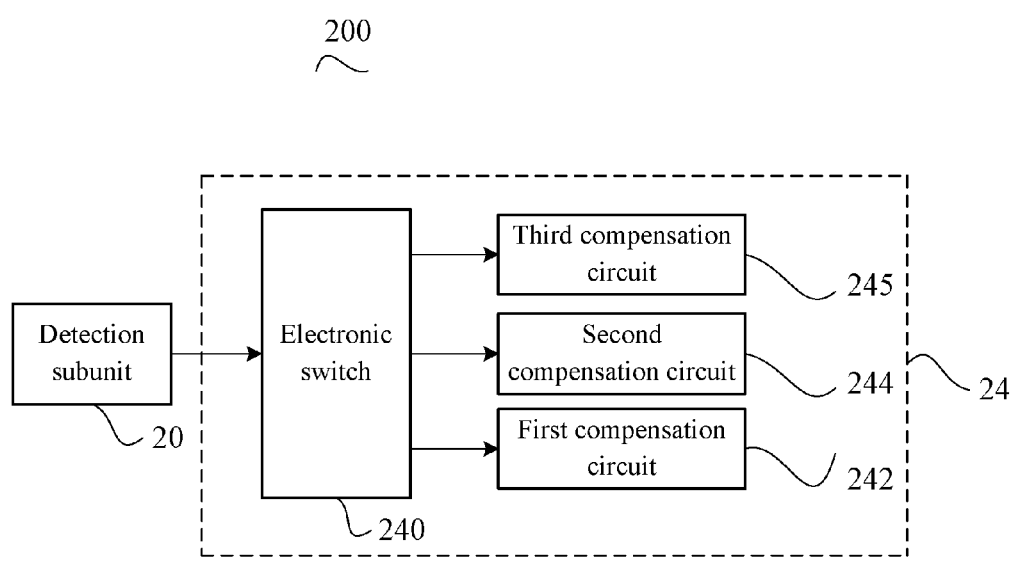
FIG. 2 is a block diagram of the audio compensation unit of FIG. 1.

Further referring to FIG. 2, the compensation subunit 24 is configured for compensating the audio signal according to the first, second, and third control signals. The compensation subunit 24 includes an electronic switch 240, a first compensation circuit 242, a second compensation circuit 244, and a third compensation circuit 245.

The electronic switch 240 is configured for enabling the first compensation circuit 242 according to the first control signal, enabling the second compensation circuit 244 according to the second control signal, and enabling the third compensation circuit 245 according to the third control signal.

The first compensation circuit 242 is configured for compensating the audio signal when the original frequency $f_i$ of the audio signal is within the low frequency band. The second compensation circuit 244 is configured for compensating the audio signal when the original frequency $f_i$ of the audio signal is within the high frequency band. The third compensation 245 is configured for compensating the audio signal when the original frequency $f_i$ of the audio signal is within the middle frequency band (neither the low frequency band nor the high frequency band).

Figure 3:
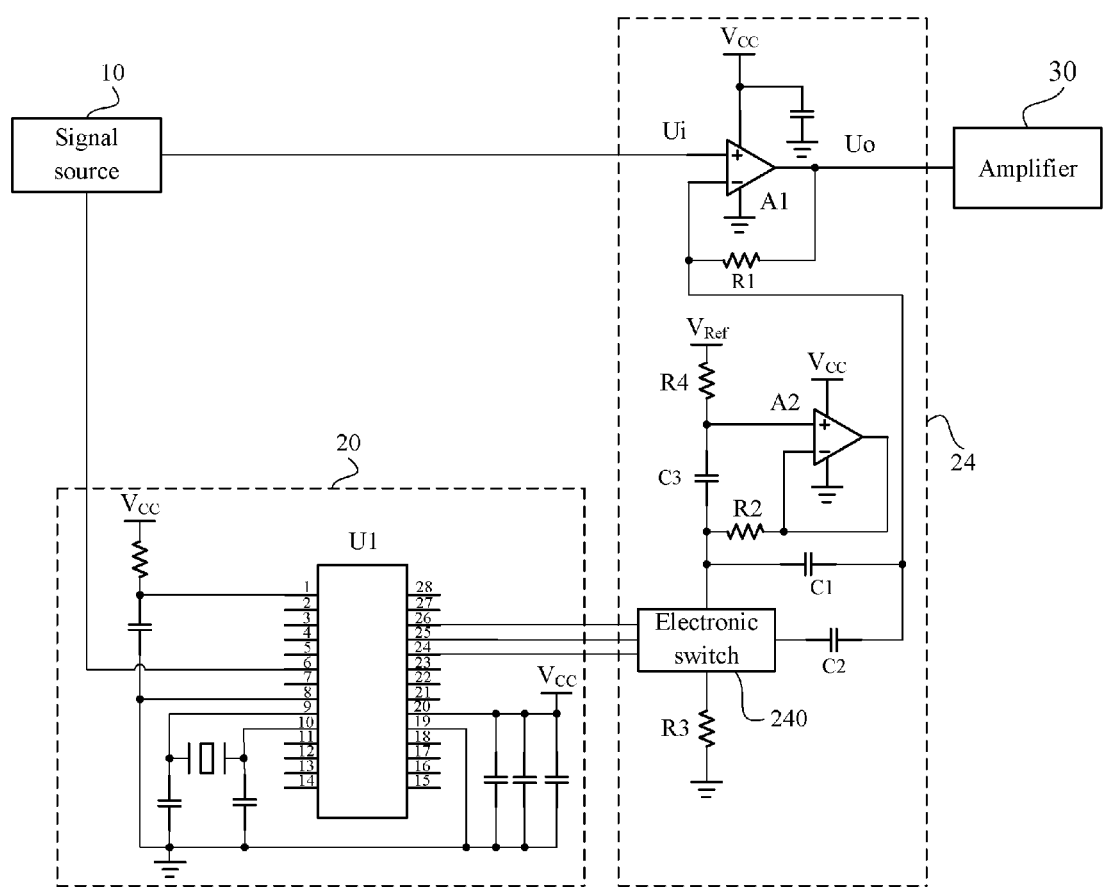
FIG. 3 is a schematic circuit diagram of the audio compensation unit of FIG. 1.

Further referring to FIG. 3, in this embodiment, the detection subunit 20 includes a control chip U1. The control chip U1 includes an input port to receive the audio signal from the signal source 10, and three output ports to output the first, second, and third control signals respectively to the electronic switch 240.

The compensation subunit 24 includes an operational amplifier A1, a frequency selector A2, a first resistor R1, a second resistor R2, a third resistor R3, a fourth resistor R4, a first capacitor C1, a second capacitor C2, and a third capacitor C3. A non-inverting input of the operational amplifier A1 is electrically connected to the signal source 10. An inverting input of the operational amplifier A1 is electrically connected to an output port of the operational amplifier A1 via the first resistor R1. A non-inverting input of the frequency selector A2 is for receiving a reference voltage via the fourth resistor R4. An inverting input of the frequency selector A2 is electrically connected to the electronic switch 240 via the second resistor R2. An output port of the frequency selector A2 is electrically connected to the inverting input of the frequency selector A2. One terminal of the first capacitor C1 is electrically connected to the inverting input of the frequency selector A2 via the second resistor R2, the other terminal of the first capacitor C1 is electrically connected to the inverting input of the operational amplifier A1. One terminal of the second capacitor C2 is electrically connected to the inverting input of the operational amplifier A1, the other terminal of the second capacitor C2 is electrically connected to the electronic switch 240. One terminal of the third capacitor C3 is electrically connected to the non-inverting input of the operational amplifier A1, the other terminal of the third capacitor C3 is electrically connected to the inverting input of the frequency selector A2 via the second resistor R2. One terminal of the third resistor R3 is electrically connected to the electronic switch 240, the other terminal of the third resistor R3 is electrically grounded.

The first capacitor C1, the second capacitor C2, and the third capacitor C3 are for constituting different resonance circuits. The first resistor R1 is for feeding back the output of the operational amplifier A1. The second resistor R2 is for determining the frequencies of the different resonance circuits. The third resistor R3 is for pulling down the inverting input of the frequency selector A2 to sustain a low level signal state. The fourth resistor R4 is for pulling up the non-inverting input of the frequency selector A2 to sustain a high level signal state.

When the control chip U1 obtains an original frequency $f_i$ from the audio signal, and the original frequency $f_i$ does not satisfy neither the expression (1) nor the expression (2), the control chip U1 outputs the third control signal. The electronic switch 240 receives the third control signal. The electronic switch 240 disables an electrical connection between the third capacitor C3 and the third resistor R3, and also disables an electrical connection between the second capacitor C2 and the third capacitor C3. The first capacitor C1 and the second resistor R2 are a series connection and constitute a resonance circuit as the third compensation circuit 245 to compensate the audio signal. A resonance frequency of the third compensation circuit 245 satisfies the following equation:

$$f = \frac{1}{2\pi} \times \frac{1}{R2} \times \frac{1}{C1} \quad (3)$$

When the original frequency $f_i$ satisfies the expression (1), the control chip U1 outputs the first control signal. The electronic switch 240 receives the first control signal. The electronic switch 240 disables an electrical connection between the third capacitor C3 and the third resistor R3, and enables an electrical connection between the second capacitor C2 and the third capacitor C3. The first capacitor C1 and the second capacitor C2 are connected in parallel, and form a series connection with the second resistor R2. The first capacitor C1, the second capacitor C2, and the second resistor R2 constitute a resonance circuit as the first compensation circuit 242 to compensate the audio signal. A resonance frequency of the first compensation circuit 242 satisfies the following equation:

$$f = \frac{1}{2\pi} \times \frac{1}{R2} \times \frac{1}{C1 + C2} \quad (4)$$

When the original frequency $f_i$ satisfies the expression (2), the control chip U1 outputs the second control signal. The electronic switch 240 receives the second control signal. The electronic switch 240 enables an electrical connection between the third capacitor C3 and the third resistor R3, and disables an electrical connection between the second capacitor C2 and the third capacitor C3. The third resistor R3 and the second resistor R2 are connected in parallel, and form a series connection with the first capacitor C1. The second resistor R2, the third resistor R3, and the first capacitor C1 constitute a resonance circuit as the second compensation circuit 244 to compensate the audio signal. A resonance frequency of the second compensation circuit 244 satisfies the following equation:

$$f = \frac{1}{2\pi} \times \frac{1}{Rz} \times \frac{1}{C1} \quad (5)$$

Wherein, the Rz is an impedance of the parallel connection between the third resistor R3 and the second resistor R2.

The resonance frequencies of the three compensation circuits 242, 244, and 245 can be adjusted when the second resistor R2 is a variable resistor or the first capacitor C1 is a variable capacitor.

As discussed above, the audio signal can be compensated by the audio compensation unit 200 under three different compensation circuits. When the original frequency $f_i$ of the audio signal is within the low frequency band, the corresponding audio signal is compensated by the first compensation circuit 242. When the original frequency $f_i$ of the audio signal is within the high frequency band, the corresponding audio signal is compensated by the second compensation circuit 242. When the original frequency $f_i$ of the audio signal is within the middle frequency band, the corresponding audio signal is compensated by the third compensation circuit 242. Thus, the compensated audio signal outputted by the loudspeaker 50 does not sound distorted. The sound formed by the compensated audio signal is clear.

Figure 4:
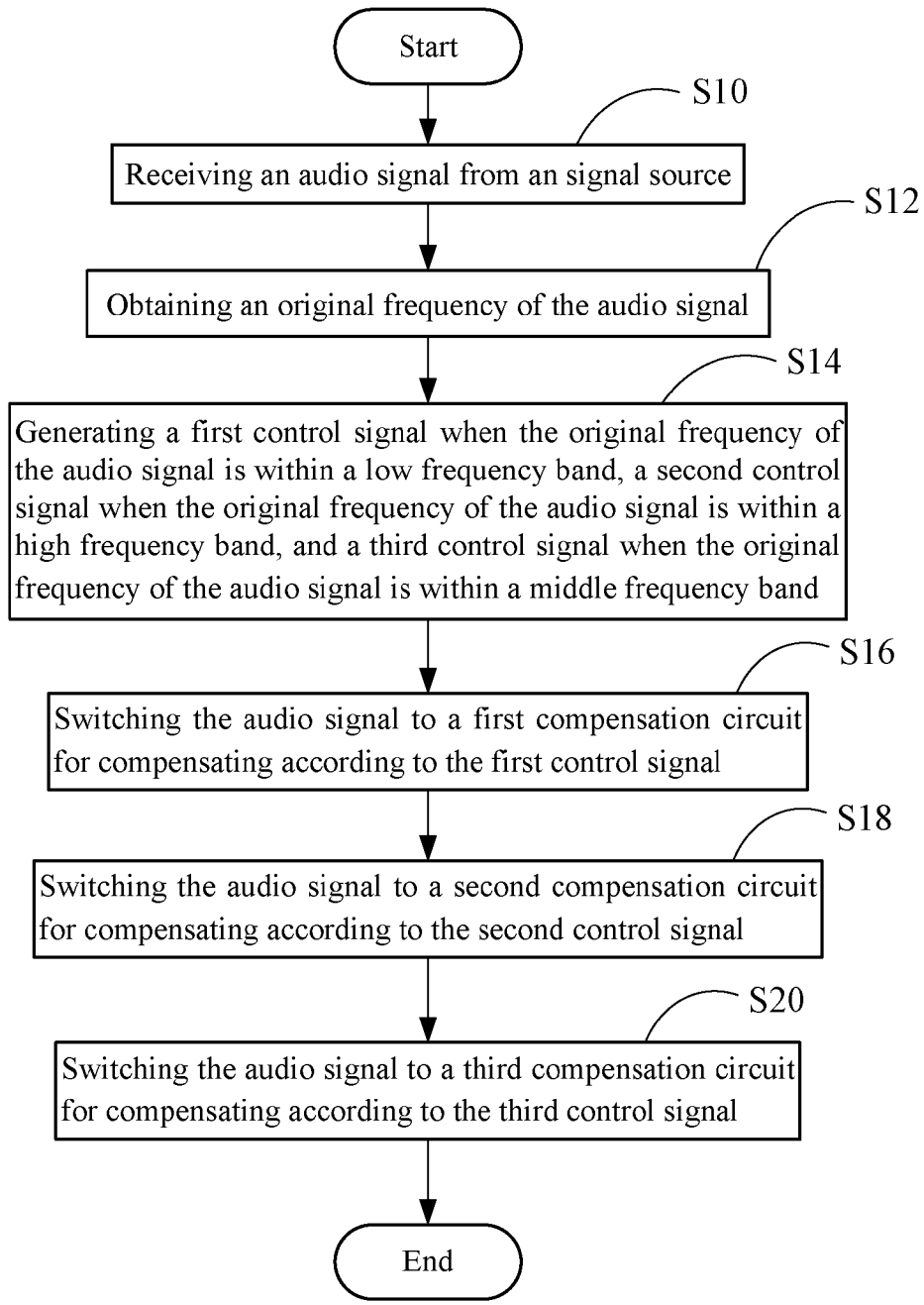
FIG. 4 is a flowchart of a compensating method in accordance with an exemplary embodiment.

Referring to FIG. 4, a flowchart of a compensating method for the audio compensation unit 200 in accordance with an exemplary embodiment is shown. The compensating method shown includes the following steps.

In step S10, receiving an audio signal from an signal source.

In step S12, obtaining an original frequency of the audio signal.

In step S14, generating a first control signal when the original frequency of the audio signal is within a low frequency band, a second control signal when the original frequency of the audio signal is within a high frequency band, and a third control signal when the original frequency of the audio signal is within a middle frequency band.

In step S16, switching the audio signal to a first compensation circuit for compensating according to the first control signal.

In step S18, switching the audio signal to a second compensation circuit for compensating according to the second control signal.

In step S20, switching the audio signal to a third compensation circuit for compensating according to the third control signal.

Steps S10, S12, and S14 are implemented by the detection subunit 20. Step S16, is implemented by the electronic switch 240 and the first compensation circuit 242 of the compensation subunit 24. Step S18, is implemented by the electronic switch 240 and the second compensation circuit 244 of the compensation subunit 24. Step S20, is implemented by the electronic switch 240 and the third compensation circuit 245 of the compensation subunit 24.

When the electronic switch 240 receives the first control signal, it disables an electrical connection between the third capacitor C3 and the third resistor R3, and enables an electrical connection between the second capacitor C2 and the third capacitor C3. Thus the first capacitor C1 and the second capacitor C2 are connected in parallel, and form a series connection with the second resistor R2, so the first capacitor C1, the second capacitor C2, and the second resistor R2 constitute the first compensation circuit 242.

When the electronic switch 240 receives the second control signal, it enables an electrical connection between the third capacitor C3 and the third resistor R3, and disables an electrical connection between the second capacitor C2 and the third capacitor C3. Thus the third resistor R3 and the second resistor R2 are connected in parallel, and form a series connection with the first capacitor C1, so the second resistor R2, the third resistor R3, and the first capacitor C1 constitute the second compensation circuit 244.

When the electronic switch 240 receives the third control signal, it disables an electrical connection between the third capacitor C3 and the third resistor R3, and also disables an electrical connection between the second capacitor C2 and the third capacitor C3. Thus the first capacitor C1 and the second resistor R2 are connected in series and constitute the third compensation circuit 245.

The advantages of the compensating method is similar with that of the compensation unit 200.

It is to be understood, however, that even though numerous has been described with reference to particular embodiments, but the present invention is not limited to the particular embodiments described and exemplified, and the embodiments are capable of considerable variation and modification without departure from the scope of the appended claims.

What is claimed is:

1. An audio compensation unit, comprising:
    a detection subunit configured for detecting an audio signal from a signal source to obtain an original frequency of the audio signal, the detection subunit defining a predetermined low frequency band and a predetermined high frequency band, the detection subunit further configured for generating a first control signal when the original frequency is within the predetermined low frequency band, and a second control signal when the original frequency is within the predetermined high frequency band;
    a compensation subunit comprising an electronic switch, a first compensation circuit, and a second compensation circuit;
    wherein the electronic switch enables the first compensation circuit to compensate the audio signal according to the first control signal, and the electronic switch further enables the second compensation circuit to compensate the audio signal according to the second control signal;
    the detection subunit further defines a middle frequency band different from either the low frequency band or the high frequency band, the detection subunit is further configured for generating a third control signal when the original frequency is within the middle frequency band;
    the compensation subunit further comprises a third compensation circuit, the electronic switch further enables the third compensation circuit for compensating the audio signal when the original frequency of the audio signal is within the middle frequency band;
    the compensation subunit further comprises:
    a first resistor;
    an operational amplifier, a non-inverting input electrically connected to the signal source, an inverting input electrically connected to an output port via the first resistor, the output port configured for outputting a compensated audio signal compensated by the compensation subunit;
    a second resistor;
    a frequency selector, an inverting input electrically connected to the electronic switch via the second resistor, an output port electrically connected to the inverting input;
    a third resistor, one terminal electrically connected to the electronic switch, the other terminal electrically grounded;
    a fourth resistor, one terminal for receiving a reference voltage, the other terminal electrically connected to the non-inverting input of the frequency selector;
    a first capacitor, one terminal electrically connected to the inverting input of the frequency selector via the second resistor, the other terminal electrically connected to the inverting input of the operational amplifier;
    a second capacitor, one terminal electrically connected to the electronic switch, the other terminal electrically connected to the inverting input of the operational amplifier; and
    a third capacitor, one terminal electrically connected to the non-inverting input of the frequency selector, the other terminal electrically connected to the inverting input of the frequency selector via the second resistor.

2. The audio compensation unit of claim 1, wherein the low frequency band satisfies a following equation: $f_{L1}<f_i<f_{L1}+f_{Lref}$, wherein $f_{Lref}$ is a predetermined low reference frequency of the detection subunit, and $f_{L1}$ is a predetermined low benchmark frequency of the detection subunit.

3. The audio compensation unit of claim 1, wherein the high frequency band satisfies a following equation: $f_{H1}<f_i<f_{H1}+f_{Href}$, wherein $f_{Href}$ is a predetermined high reference frequency of the detection subunit, and $f_{H1}$ is a predetermined high benchmark frequency of the detection subunit.

4. The audio compensation unit of claim 1, wherein the middle frequency band satisfies a following equation: $f_{L1}+f_{Lref}<f_i<f_{H1}$, wherein $f_{Lref}$ is a predetermined low reference frequency of the detection subunit, $f_{L1}$ is a predetermined low benchmark frequency of the detection subunit, $f_{Href}$ is a predetermined high reference frequency of the detection subunit, and $f_{H1}$ is a predetermined high benchmark frequency of the detection subunit.

5. The audio compensation unit of claim 1, wherein when the electronic switch receives the first control signal, the electronic switch disables an electrical connection between the third capacitor and the third resistor, and enables an electrical connection between the second capacitor and the third capacitor, thus the first capacitor and the second capacitor are connected in parallel, and form a series connection with the second resistor, so as to the first capacitor, the second capacitor, and the second resistor constitute the first compensation circuit.

6. The audio compensation unit of claim 1, wherein when the electronic switch receives the second control signal, the electronic switch enables an electrical connection between the third capacitor and the third resistor, and disables an electrical connection between the second capacitor and the third capacitor, thus the third resistor and the second resistor are connected in parallel, and form a series connection with the first capacitor, so as to the second resistor, the third resistor, and the first capacitor constitute the second compensation circuit.

7. The audio compensation unit of claim 1, wherein when the electronic switch receives the third control signal, the electronic switch disables an electrical connection between the third capacitor and the third resistor, and also disables an electrical connection between the second capacitor and the third capacitor, the first capacitor and the second resistor are a series connection and constitute the third compensation circuit.

8. The audio compensation unit of claim 1, wherein the second resistor is a variable resistor, and the first capacitor is a variable capacitor.

9. A method for compensating audio signals, comprising:
receiving an audio signal from a signal source;
obtaining an original frequency of the audio signal;
generating a first control signal when the original frequency of the audio signal is within a predetermined low frequency band, and a second control signal when the original frequency of the audio signal is within a predetermined high frequency band;
enabling a first compensation circuit to compensate the audio signal according to the first control signal;
enabling a second compensation circuit to compensate the audio signal according to the second control signal;
wherein a compensation unit is defined by the first, second, and third compensation circuits, and an electronic switch, the compensation unit comprises:
a first resistor;
an operational amplifier, a non-inverting input electrically connected to the signal source, an inverting input electrically connected to an output port via the first resistor, the output port configured for outputting a compensated audio signal compensated by the compensation subunit;
a second resistor;
a frequency selector, an inverting input electrically connected to the electronic switch via the second resistor, an output port electrically connected to the inverting input;
a third resistor, one terminal electrically connected to the electronic switch, the other terminal electrically grounded;
a fourth resistor, one terminal for receiving a reference voltage, the other terminal electrically connected to the non-inverting input of the frequency selector;
a first capacitor, one terminal electrically connected to the inverting input of the frequency selector via the second resistor, the other terminal electrically connected to the inverting input of the operational amplifier;
a second capacitor, one terminal electrically connected to the electronic switch, the other terminal electrically connected to the inverting input of the operational amplifier; and
a third capacitor, one terminal electrically connected to the non-inverting input of the frequency selector, the other terminal electrically connected to the inverting input of the frequency selector via the second resistor.

10. The method of claim 9, further comprising:
generating a third control signal when the original frequency of the audio signal is within a middle frequency; and
enabling a third compensation circuit to compensate the audio signal according to the third control signal.

11. The method of claim 9, further comprising:
receiving the first control signal; and
disabling an electrical connection between the third capacitor and the third resistor, and enabling an electrical connection between the second capacitor and the third capacitor, thus the first capacitor and the second capacitor are connected in parallel, and form a series connection with the second resistor, so as to the first capacitor, the second capacitor, and the second resistor constitute the first compensation circuit.

12. The method of claim 9, further comprising:
receiving the second control signal; and
enabling an electrical connection between the third capacitor and the third resistor, and disabling an electrical connection between the second capacitor and the third capacitor, thus the third resistor and the second resistor are connected in parallel, and form a series connection with the first capacitor, so as to the second resistor, the third resistor, and the first capacitor constitute the second compensation circuit.

13. The method of claim 9, further comprising:
receiving the third control signal; and
disabling an electrical connection between the third capacitor and the third resistor, and also disabling an electrical connection between the second capacitor and the third capacitor, thus the first capacitor and the second resistor are a series connection and constitute the third compensation circuit.

\* \* \* \* \*